Dec. 3, 1963 R. A. WOLFF 3,113,178

OSCILLATOR CIRCUIT

Filed Nov. 29, 1960 2 Sheets-Sheet 1

INVENTOR.
Robert A. Wolff
BY John [signature]
ATTY.

Dec. 3, 1963 R. A. WOLFF 3,113,178

OSCILLATOR CIRCUIT

Filed Nov. 29, 1960 2 Sheets-Sheet 2

INVENTOR.
Robert A. Wolff
BY John L. [signature]
ATTY.

United States Patent Office 3,113,178

Patented Dec. 3, 1963

3,113,178

OSCILLATOR CIRCUIT

Robert A. Wolff, La Grange Park, Ill., assignor to Admiral Corporation, Chicago, Ill., a corporation of Delaware Filed Nov. 29, 1960, Ser. No. 72,479

6 Claims. (Cl. 178—5.8)

Broadly this invention relates to oscillators. Specifically, it relates to oscillators used in television receivers and more specifically to such oscillators used in television receivers having remote control units attached thereto.

Recently there has been a marked tendency on the part of both public and industry in favor of television receivers which may be controlled from a point remote from the receiver itself. These systems in the main comprise a remote control unit mounted at the television receiver and a portable transmitter which may be carried about by the viewer. Any type of energy may be used to carry control signals, although at present the major emphasis seems to be on ultrasonic energy.

The particular system in which the invention is to be described, and in which the invention will most readily find a need, is one in which ultrasonic signals are transmitted from the transmitter to the receiver. In this system, frequency of the control signal transmitted is the determinant of the control function to be performed. In the system under consideration these control frequencies are approximately 38,000 c.p.s. and 42,000 c.p.s.

Advances in this art have also led to the development of an all transistorized remote control unit which may be left operating continuously since its power consumption is less than that of an ordinary electric clock. Such a unit provides for complete remote control of a television receiver including the "on and off" function.

It was discovered in production of such remote control television receivers that occasionally a receiver, which was in all other respects satisfactory, could not be turned off by the remote control unit. That is, the set could be initially turned off, but would immediately result in the "on" relay being operated. On investigation, the problem was pinpointed to the horizontal oscillator in the television receiver, which oscillator was apparently changing frequency when the television receiver was turned off. As the power supply voltage decreased to a very low point, following turn off of the set, it was found that the horizontal oscillator began to change frequency in an upward direction. In certain sets the horizontal oscillator frequency quickly reached approximately 21,000 c.p.s. and the second harmonic of this frequency was sufficiently strong to activate the on-off function of the remote control unit. Thus, the set was turned on again. In most cases, selection of the horizontal oscillator tube would clear up the problem. However such a solution was not considered acceptable both from a production standpoint and from a service standpoint.

It was believed that the majority of signal pickup by the remote control unit from the horizontal oscillator was via radiation. Consequently, it was felt that adequate shielding of the remote control unit would be one way of overcoming the problem. However, economically speaking, this solution was not desirable. Further efforts were expended in developing a circuit arrangement whihch would disable the horizontal oscillator before the power supply voltage decayed to a point where substantial frequency change occurred. The results of these efforts and the circuit arrangement therefor are the subject matter of this application and will be described hereinafter.

Accordingly it is a general object of this invention to provide an improved remote control television receiver.

Another object of this invention is to provide a circuit arrangement whereby oscillatory voltages developed in the controlled unit, upon decay of the positive potential thereof, are prevented from interacting with the control unit.

A feature of this invention resides in placing a small neon glow lamp in the anode-cathode circuit of the horizontal oscillator tube in a television receiver for disabling said tube when the power supply voltage decays to a point where frequency changes are likely to occur.

Other objects and features of this invention will become apparent upon a reading of the specification in conjunction with the drawings in which.

Figure 1:
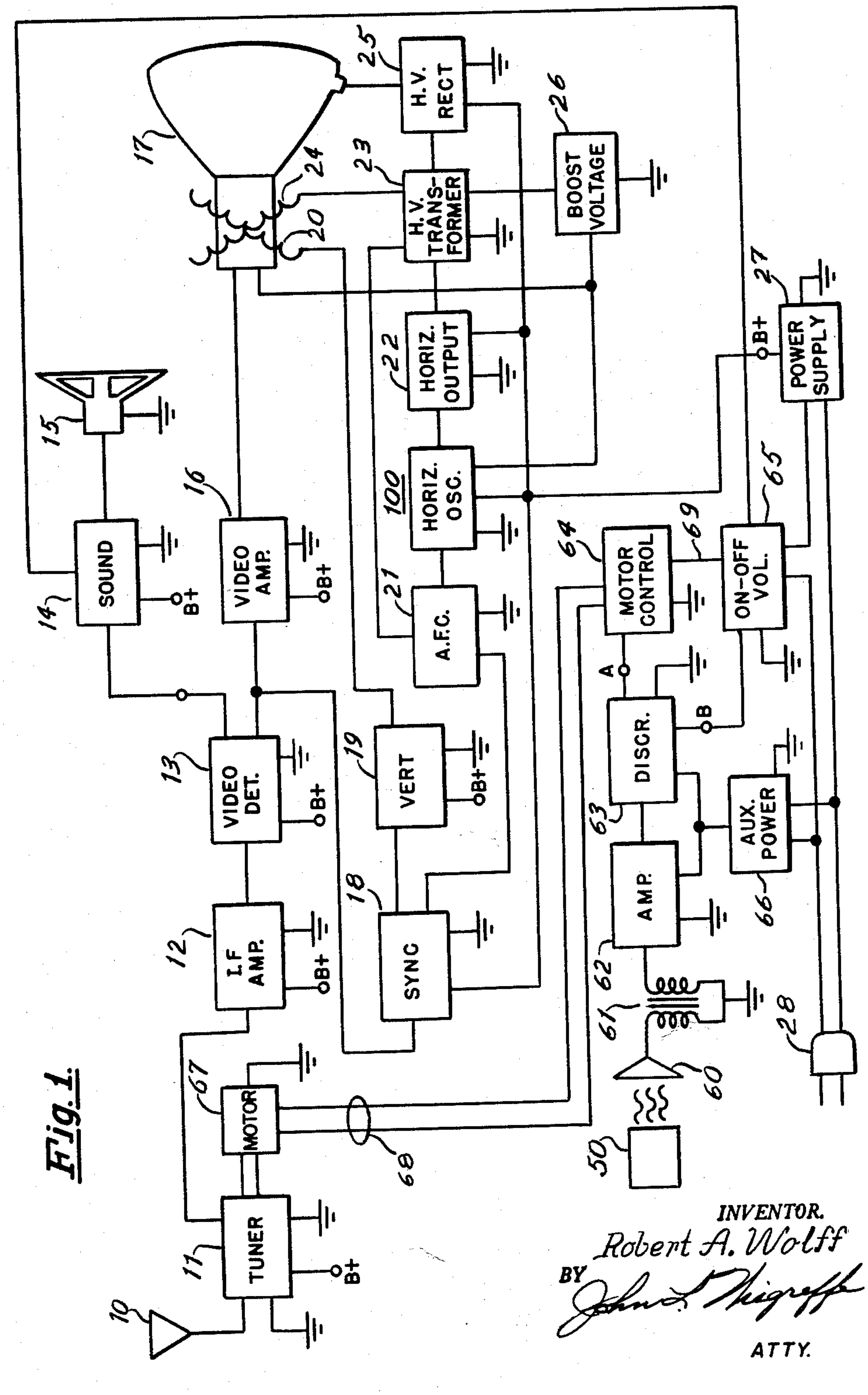
FIG. 1 is a block diagram of a complete television receiver and remote control unit therefor.

Referring now to FIG. 1, there is shown in block form a diagram of a television receiver and remote control unit therefor. Antenna 10 receives a composite television signal containing video information, sound information, line synchronizing components and field sychronizing components. The received signal is fed to tuner 11 where the carrier frequency is heterodyned, in a well known manner, with the output of a local oscillator (not shown), thus producing an intermediate frequency composite television signal. This signal is fed to an IF amplifier 12 where it is amplified and coupled to a video detector 13. The sound portion of the signal is removed from the output of the video detector and fed to a sound circuit 14 where it is detected, amplified and utilized to drive a speaker 15.

Video detector 13 also detects the video portion of the signal, including the synchronizing components, which is then fed to video amplifier 16 and thence to picture reproducing tube 17. The video signal varies the modulation of the electron beam in the picture tube in a well known manner. A portion of the output of video detector 13 is also sent to the synchronizing signal separator 18. Here the synchronizing components are stripped off and fed to vertical circuit 19. Vertical circuit 19 responds only to the field synchronizing components, and in conjunction with vertical deflection windings 20, develops the proper field frequency deflection voltages for deflecting the picture tube electron beam in the vertical direction. Synchronizing components from sync separator 18 are also fed to AFC circuit 21, which is responsive only to the horizontal or line, synchronizing components, and which, in a manner well known in the art, insures synchronism between horizontal oscillator 100 and the line synchronizing components in the received television signal.

Horizontal oscillator 100 is of the free running type, that is, upon energization it will normally oscillate at a frequency close to the line synchronizing frequency of the received television signal. The output of horizontal oscillator 100 is fed to horizontal output circuit 22 and the output of this circuit drives high voltage transformer 23. Horizontal deflection windings 24 are connected to high voltage transformer 23 and develop appropriate horizontal scan voltages for the electron beam in picture tube 17. High voltage transformer 23 also supplies a high voltage rectifier 25 which develops the high direct current potential necessary for operation of picture reproducing tube 17.

High voltage transformer 23 is also coupled to a boost supply voltage generator 26 which, in the case shown, supplies the accelerating electrode (not shown) in picture tube 17 and horizontal oscillator 100. It will be recognized that boost supply voltage generator 26 is not essential for operation of the receiver, although it has been expedient to use such a supply to obviate the need for a higher voltage power supply.

High voltage transformer 23 also supplies pulses of high potential to AFC circuit 21, which is effective in a manner well known in the art for comparing the output of sync separator 18 with the frequency of the voltage pulses from the high voltage transformer. Any deviation in the frequency therebetween gives rise to appropriate changes in a control voltage which is used to control the frequency of oscillator 100.

A remote control unit comprising microphone 60, input transformer 61, amplifier 62 and discriminator 63 is also shown. In this embodiment, the remote control unit is assumed to be responsive to ultrasonic control signals transmitted from transmitter 50. Discriminator 63 contains circuitry (not shown) for energizing output A, responsive to one of the control frequencies being transmitted, and output B responsive to the other of the control signals being transmitted. The remote control amplifier is energized by an auxiliary power supply 66, which is designed for continuous operation.

Output B of discriminator 63 is connected to on-off volume circuit 65, which contains a four position stepping switch arranged to turn the set on and incrementally vary the audio setting of the television receiver for the first three actuations thereof and to turn the set off on the fourth actuation thereof. Output A of discriminator 63 is connected to motor control 64 which controls operation of motor 67, connected to tuner 11, via leads 68.

The combination of motor 67 and tuner 11 includes an arrangement (not shown) whereby the motor is automatically deenergized as tuner 11 is driven from one preselected tuning position to an adjacent preselected tuning position. Additionally, motor control 64 is rendered inoperative until energized from on-off volume control 65 over lead 69. This provides an interlocking arrangement whereby transmission of the control signal corresponding to output A of discriminator 63 will be ineffective to operate motor 67 unless the television receiver has been turned on. On-off volume control 65 is also arranged to control application of A.C. power to power supply 27 which supplies the necessary voltages for the television receiver. It should be noted at this point that no provision is indicated for supplying the necessary heater voltages for the various electron discharge tubes in the circuits. This omission is made in the interest of clarity as such connections may be easily supplied by anyone skilled in the art.

To review the operation of the remote control unit, first assume that the television receiver is off. The remote control unit however is energized by auxiliary power supply 66 and is therefore in a ready or standby condition. Upon transmission of an appropriate control signal from transmitter 50, discriminator 63 energizes its output B, and the on-off volume control circuit 65 operates. This simultaneously activates power supply 27 to energize the television receiver, and to set the sound level of the receiver at a first level. Thereafter, the next two transmissions of the same control frequency from transmitter 50 will effect increases in the sound level. A fourth transmission of this control frequency will disconnect power supply 27 from the source of A.C. power (not shown) and cause the television receiver to be turned off. When the receiver is on, transmission of the other control frequency of transmitter 50 energizes output A of discriminator 63 and results in motor 67 driving tuner 11 to the next preselected station tuning position.

Figure 2:
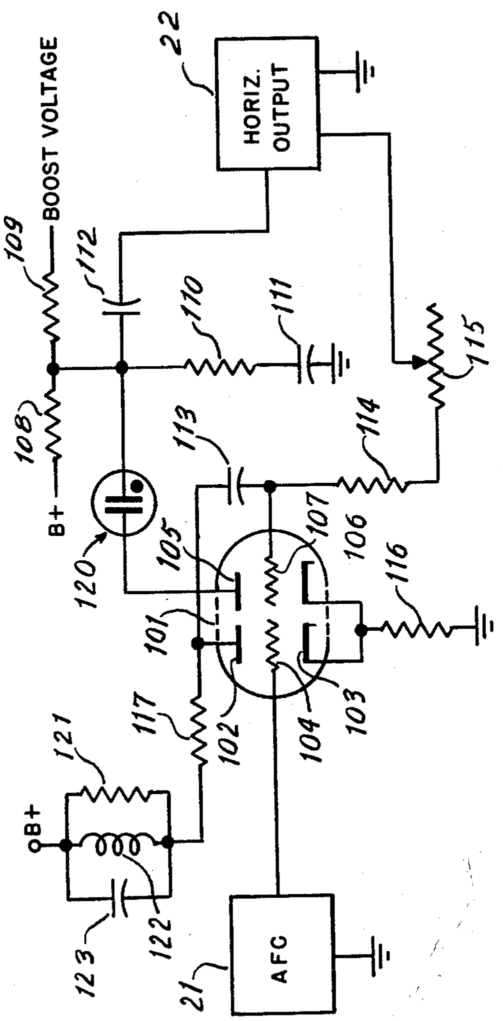
FIG. 2 is a schematic diagram of the portion of FIG. 1 in which the invention is depicted.

Referring now to FIG. 2, there is shown a detailed schematic diagram of oscillator circuit 100 and its connection to AFC circuit 21 and horizontal output circuit 22. A dual triode tube 101, connected in a conventional multi-vibrator arrangement, is shown. It will be understood however that any of the well known types of oscillator circuits may be used. Tube 101 contains a left triode section comprising an anode 102, a cathode 103, and a control grid 104. The right triode comprises an anode 105, a cathode 106, and a control grid 107. Cathodes 103 and 106 are connected to ground through a common cathode resistor 116. Anode 102 is fed from a source of B+ voltage through a tuned circuit, comprising capacitor 123, inductor 122 and resistor 121, and a load resistor 117. Resistor 121 serves to lower the "Q" of the tune dcircuit which is necessary to enable the oscillator to change frequency slightly upon changes in the control voltage applied to grid 104 from the AFC circuit. Anode 102 is coupled by a coupling capacitor 113 to control grid 107. Grid 107 is also connected through a resistor 114 and a variable resistor 115 to horizontal output circuit 22.

Variable resistor 115 serves to vary the horizontal frequency locking range of tube 101. Anode 105 is connected to a gas filled tube or glow lamp 120 and thence, through a load resistor 108, to a source of B+ potential. The junction of load resistor 108 and gas tube 120 is also connected, through another load resistor 109, to a source of boost voltage. A coupling capacitor 112 couples this junction to the horizontal output circuit 22, and a resistance capacitance combination 110 and 111 respectively, connects this junction to ground. The reason for the connection to a source of boost voltage will be discussed below.

Upon application of operating potentials thereto, horizontal oscillator 100 begins to oscillate, in a well known manner, at approximately 15,750 cycles per second. Capacitor 113 provides the coupling between the left triode and the right triode and the common cathode resistor 116 provides a coupling between the right triode and the left triode. The frequency of oscillation of this circuit is controlled by a control voltage applied by AFC circuit 21 to grid 104 of the left triode. This control voltage in turn is developed by comparison of the pulses from high voltage transformer 23 with the synchronizing components from synchronizing signal separator 18, shown in FIG. 1.

Figure 4:
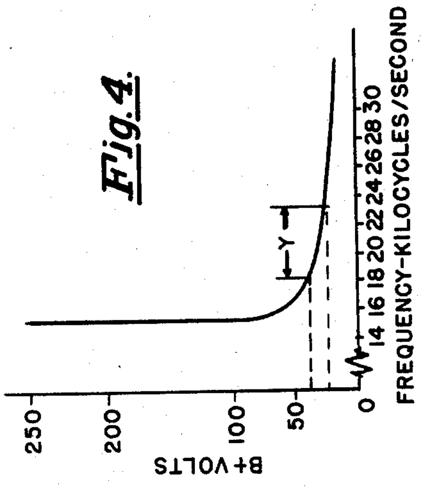
FIGS. 3 and 4 are graphical representations of the decay of the positive potential of the television receiver with time and the increase in frequency of the horizontal oscillator with voltage decay, respectively.
Figure 3:
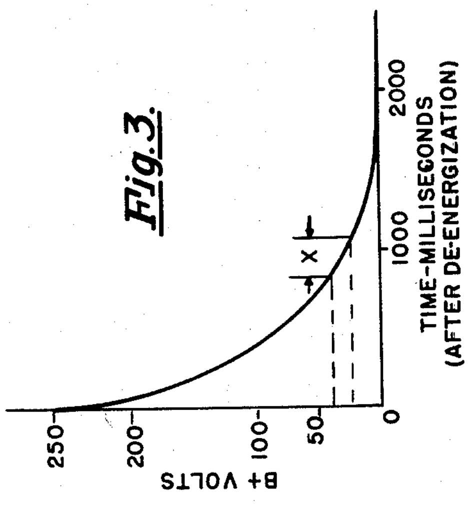

In FIG. 3 a graph is plotted which depicts the B+ potential of the television receiver power supply over a period of time up to 2,000 milliseconds after deenergization of the television receiver. FIG. 4 depicts the change in frequency of the horizontal oscillator 100 of the television receiver as the B+ voltage applied to it decreases.

It has been discovered that when the supply voltage to the right triode of oscillator 101 decreases to about 30 volts, oscillator 101 begins to oscillate in the 18 to 22 kilocycle range and has substantial output at the second harmonic of its fundamental frequency. This range is of course variable and is dependent to a great extent upon the particular oscillator tube and its associated circuitry. The critical voltage as it is called is the actual direct current voltage drop across the tube and its associated load resistor. In FIG. 2, assuming for the moment that the boost voltage connection is not present and that glow lamp 120 is shorted out, this voltage would appear from B+ across load resistor 108, across anode 105 and cathode 106 and across cathode resistor 116, to ground.

The curve of FIG. 3 indicates the decay of B+ voltage beginning with the time that the set is turned off. As will be seen from the curve, the segment indicated by the letter X represents the time interval over which the B+ voltage is in the critical range above mentioned, and is on the order of 200 milliseconds. It will be understood that this curve is merely representative and is determined by the actual television receiver itself, that is the amount of loading on the power supply, the degree of filtering of the B+ voltage, etc. It should also be noted that any change in the oscillator section itself, such as removal of the oscillator tube will not substantially affect this decay curve.

Looking over at FIG. 4, the portion of the curve indicated by Y depicts the frequency shift the oscillator may suffer as the B+ voltage goes through the critical range. From this curve it may be seen that in this critical range the oscillator swings from approximately 19 kilocycles per second to 23 kilocycles per second and that second harmonics of these frequencies would lie in the range from 38 kc. p.s. to 46 kc. p.s. Frequencies in this range lie in the control signal frequency band of the remote control amplifier.

The use of a gas tube such as glow lamp 120 in FIG. 2 in the anode cathode circuit of the horizontal oscillator tube has been found to effectively obviate the problem by cutting off the oscillator tube before the voltage drop across it reaches the critical range. As is well known, a gas filled tube, once conduction is initiated therein, maintains a fairly constant direct current voltage drop across its terminals for a relatively wide range of currents. The gas tube initially requires a starting voltage which is higher than its sustaining voltage. Additionally, the gas tube must have a certain minimum current flowing through it to maintain conduction therein. If this minimum current is not maintained, de-ionization occurs and conduction ceases. In brief, a gas tube is substantially an "on-off" device, at least for currents in the vicinity of said minimum.

A vacuum tube on the other hand will draw a current which is dependent upon the potentials across it and the bias supplied to it. Additionally as the operating potentials on the vacuum tube are varied its effective impedance, looking at it as a two terminal network (the terminals being the cathode and anode), is changed. Further, the characteristics of the vacuum tube may be ascertained with a high degree of certainty. This fact allows us to select a gas tube which will coact with the vacuum tube in such a manner as to effectively obviate the problem heretofore referred to.

The circuit constants and the B+ voltage are selected to produce the desired direct current operating potential across oscillator tube 101 with gas tube 120 connected as shown. Gas tube 120 may be assumed to have a relatively constant potential drop of approximately 60 volts across its terminals. For A.C. purposes, tube 120 has negligible impedance and consequently very little A.C. potential drop appears across its terminals. When the television receiver is turned off, the B+ voltage decays substantially along a curve indicated in FIG. 3. During this decay a fairly constant voltage is maintained across gas tube 120 and the difference between this constant voltage and the potential from B+ to ground is the potentional across the right hand triode of oscillator tube 101. As the potential across oscillator tube 101 decreases, a correspondingly smaller current is drawn through the tube. To say this another way, the effective impedance in series with gas tube 120 increases quite rapidly. As the B+ voltage decays further, a point is reached where the current drawn by tube 101 is so slight that conduction can no longer be maintained in gas tube 120 and gas tube 120 deionizes, thus opening the B+ circuit to anode 105. That is, the effective impedance in series with gas tube 120 increases rapidly to a point where sufficient current to maintain ionization therein is no longer available. In the actual circuit shown this point is reached when the B+ voltage is at about 100 volts. At 100 volts approximately 60 volts appear across gas tube 120 and about 40 volts appear across the tube circuit.

Reference to FIG. 4 shows that with 40 volts across the oscillator tube, its frequency of oscillation is still outside the critical range. As the B+ voltage drops below about 100 volts, deionization occurs in gas tube 120 and the tube 101 (right triode) is deenergized. Hence the oscillator tube is deenergized before it can substantially change frequency.

Referring again to the circuit of FIG. 2 resistor 109 couples the junction of resistor 108 and gas tube 120 to a source of boost voltage. This boost connection represents a refinement of the basic circuit and, although it is not a necessary part thereof, yields a very practical arrangement. As is well known in the art, boost voltage is generated by rectification of a portion of the high voltage developed in the receiver. This high voltage is in turn dependent upon the horizontal output tube which in turn is dependent upon the horizontal oscillator tube. In most modern day television receivers a source of boost voltage is made available for one of the accelerating electrodes in the picture tube.

The boost connection shown in FIG. 2 also allows the invention to be practiced in a conventional television receiver merely by adding a gas tube 120 and connecting its junction with load resistor 108 to a source of boost voltage. By proper selection of resistors, this connection to boost voltage allows the oscillator tube itself to be operated at the same anode to cathode potential existing thereacross before the addition of the gas tube. In normal operation, the horizontal oscillator tube is run from the combination of B+ and boost voltage. The connection to normal B+ is necessary for starting the oscillator since the boost voltage is dependent upon the horizontal oscillator output. Thus it may be understood that while the boost voltage connection is not necessary to the basic operation of the invention, its presence therewith makes FIG. 2 a preferred embodiment of the invention.

Representative values for the components of FIG. 2 are as follows:

| | | |
|---|---|---|
| **108** | ohms | 120,000 |
| **109** | do | 270,000 |
| **110** | do | 16,000 |
| **111** | micromicrofarads | 680 |
| **112** | do | 4,700 |
| **113** | do | 820 |
| **114** | ohms | 22,000 |
| **115** | do | 45,000 |
| **116** | do | 1,200 |
| **117** | do | 10,000 |
| **121** | do | 56,000 |
| **122** | millihenries | 16–50 |
| **123** | micromicrofarads | 3,900 |
| **101** | | 6CG7 |
| **120** | | NE2H |
| B+ | volts | 265 |
| Boost | do | 445 |

It will be appreciated by those skilled in the art that by proper selection of the vacuum tube and the gas tube and the operating conditions for the vacuum tube, that the desired effect may be achieved at many other points on the decay curve. It should also be apparent that what has been described is a preferred embodiment of the inventive concept involved and that numerous other applications will readily present themselves to those skilled in the art.

What is claimed is:

1. In combination: a television receiver and a source of operating potentials therefor; a free running horizontal oscillator in said television receiver for generating an oscillatory voltage of substantially the frequency of line synchronizing components in received composite television signals; a remote control unit having a separate power source and adapted to control, in response to a remotely transmitted control signal of predetermined frequency lying within a restricted frequency range, energization and deenergization of said source of said operating potentials; said remote control unit mounted adjacent to said television receiver and being subjected to radiations therefrom; said oscillatory voltage frequency normally lying outside said restricted frequency range and not interacting with said remote control unit; said horizontal oscillator changing frequency substantially upon decay of said operating potentials after deenergization of said source of operating potentials and producing oscillations within said restricted frequency range; and circuit means coupled to said horizontal oscillator for completely disabling the same when said operating potentials fall below a certain minimum value to prevent any substantial frequency change in said oscillatory voltage.

2. In combination: an oscillator circuit and a source of operating potentials therefor; a separately energized control unit adapted to energize and deenergize said source of operating potentials in response to transmission, from a point remote from said unit, of a control signal of predetermined frequency; said control unit being located in proximity to said oscillator circuit and subjected to energy radiated therefrom; the frequency of said oscillator being such that normally no interaction between said oscillator circuit and said control unit occurs; said oscillator frequency changing upon decay of said operating potentials resulting from deenergization of said source of operating potentials, and over a certain range of operating potentials being harmonically related to said predetermined frequency; and means in circuit with said oscillator for disabling said oscillator when said operating potentials decay to a point where frequency change of said oscillator occurs.

3. In combination: an oscillator including an electron valve having an anode electrode, a cathode electrode, and a control electrode; supply means for supplying operating potentials to said electrodes for causing said oscillator to oscillate at a predetermined frequency; a separately energized control unit mounted in proximity to said oscillator and adapted to energize and deenergize said supply means in response to remotely transmitted control signals of a particular frequency lying within a restricted frequency range; said oscillator frequency normally lying outside said restricted frequency range; said oscillator changing ferquency when said operating potentials decay to a certain value upon deenergization of said supply means and producing oscillations which are harmonically related to said particular frequency, said last mentioned oscillations being capable of falsely actuating said control unit; and a gas filled glow lamp serially connected between said supply means and said electron valve for disabling said oscillator completely before said operating potentials decay to said certain value.

4. In a television receiver, a stabilized horizontal oscillator circuit comprising; an electron discharge device having an anode electrode, a cathode electrode, and a control electrode; a first source of direct current potential; a second source of direct current potential connected to and dependent upon the output of said horizontal oscillator; a load resistor connected from said first source of direct current potential to a junction; a second load resistor connected from said second source of direct current potential to said junction; a gaseous glow tube connected between said junction and said anode electrode; said connection to said first source of direct current potential enabling said horizontal oscillator to commence oscillation upon energization of said television receiver; said connection to said second source of direct current potential enabling said oscillator to operate at a higher potential than available from said first source of direct current potential; said gaseous glow tube preventing said oscillator from changing frequency substantially upon deenergization of said television receiver and consequent decay of both said first and said second sources of direct current potentials.

5. In combination; a television receiver including a free running oscillator for generating horizontal sweep voltages; control means for said television receiver; said control means including means operative in response to remotely transmitted signals of predetermined frequency lying within a restricted frequency range; said control means being situated such that it is subject to radiation from said oscillator; the frequency of said oscillator sweep voltage normally lying outside said restricted frequency range and not affecting operation of said control means; the frequency of said oscillator changing upon deenergization of said television receiver and producing radiations within said restricted frequency range; said radiations within said restricted frequency range occurring substantially only when the operating potentials for said oscillator pass through a critical range; and means coupled to said oscillator for deenergizing the same upon deenergization of said television receiver before the operating potentials thereto reach said critical range whereby said radiations within said restricted frequency range are prevented.

6. In combination: circuit means undesirably susceptible to particular frequency radiations in the vicinity thereof; an oscillator necessarily located in proximity to said circuit means; a direct current power supply for said oscillator; said oscillator desirably maintaining a frequency different from said particular frequency but undesirably experiencing a frequency shift embracing said particular frequency upon deenergization of said direct current power supply; said oscillator including an anode and a cathode coupled across said power supply; and means preventing radiation of said particular frequency by said oscillator thereby precluding pick up thereof by said circuit means comprising; a gas filled glow lamp serially connected between said power supply and said oscillator; said gas filled glow lamp requiring a predetermined minimum current to maintain ionization therein and having a potential developed thereacross which is substantially constant under the normal operating conditions of said oscillator; the impedance of said oscillator increasing markedly upon deenergization of said power supply, and consequent decay of the potential across said oscillator, and reducing the current in said glow lamp to a value less than said predetermined minimum before said oscillator changes frequency substantially, whereby said glow lamp is extinguished and said oscillator is quickly disabled.

References Cited in the file of this patent

UNITED STATES PATENTS 2,230,216 Boers ---------------- Jan. 28, 1941